(12) United States Patent
Nagareda et al.

(10) Patent No.: US 9,159,904 B2
(45) Date of Patent: Oct. 13, 2015

(54) PIEZOELECTRIC CERAMIC COMPOSITION

(75) Inventors: Kenji Nagareda, Aichi (JP); Atsuhiro Hayashi, Aichi (JP)

(73) Assignee: HONDA ELECTRONICS CO., LTD., Aichi (JP)

( * ) Notice: Subject to any disclaimer, the term of this patent is extended or adjusted under 35 U.S.C. 154(b) by 0 days.

(21) Appl. No.: 14/123,780

(22) PCT Filed: Jun. 26, 2012

(86) PCT No.: PCT/JP2012/066832
§ 371 (c)(1),
(2), (4) Date: Dec. 4, 2013

(87) PCT Pub. No.: WO2014/002285
PCT Pub. Date: Jan. 3, 2014

(65) Prior Publication Data
US 2015/0099085 A1    Apr. 9, 2015

(51) Int. Cl.
| | | |
|---|---|---|
| *B32B 3/02* | (2006.01) | |
| *H01L 41/187* | (2006.01) | |
| *H01L 41/08* | (2006.01) | |
| *C04B 35/495* | (2006.01) | |
| *C04B 35/626* | (2006.01) | |

(52) U.S. Cl.
CPC .......... *H01L 41/1873* (2013.01); *C04B 35/495* (2013.01); *C04B 35/6261* (2013.01); *C04B 35/62695* (2013.01); *H01L 41/0805* (2013.01); *H01L 41/1878* (2013.01); *C04B 2235/3201* (2013.01); *C04B 2235/3203* (2013.01); *C04B 2235/3255* (2013.01); *C04B 2235/3272* (2013.01); *C04B 2235/3294* (2013.01); *C04B 2235/3298* (2013.01); *C04B 2235/40* (2013.01); *C04B 2235/405* (2013.01); *Y10T 29/42* (2015.01)

(58) Field of Classification Search
CPC ............ H01L 41/1873; H01L 41/1878; H01L 41/0805; Y10T 29/42
See application file for complete search history.

(56) References Cited

U.S. PATENT DOCUMENTS

2004/0058797 A1* 3/2004 Nonoyama et al. ............ 501/134
2009/0267016 A1* 10/2009 Fukuoka et al. ....... 252/62.9 PZ

FOREIGN PATENT DOCUMENTS

| JP | 2006-151790 | 6/2006 |
| JP | 4631246 | 11/2010 |
| WO | 2008/032500 | 3/2008 |

OTHER PUBLICATIONS

M. Jiang et al., "Phase structures . . . -BiFeO3 ceramics", ScienceDirect, College of Material Science and Engineering, Revised Nov. 13, 2008, Accepted Feb. 6, 2009.
Scripta Materialia, A Letters Journal, vol. 60, Issue 10, May 2009.

* cited by examiner

*Primary Examiner* — Elizabeth Mulvaney
(74) *Attorney, Agent, or Firm* — Clark & Brody

(57) ABSTRACT

This invention provides for a piezoelectric ceramic composition having a lead-free alkaline niobate piezoelectric ceramic composition with a favorable piezoelectric property. This invention refers to a piezoelectric ceramic composition 10 that is described as composition formula $\{Li_x(K_{1-y}Na_y)_{1-x}\}(Nb_{1-z}Sb_z)O_3$ including the additives of the metallic elements Bi and Fe within the range of the following relational expressions: $0.03 \le x \le 0.045$; $0.5 \le y \le 0.58$; $0.03 \le z \le 0.045$; and $0.006 \le v \le w \le 0.010$ whereof v is the additive amount of Bi (molar ratio), and w is the additive amount of Fe (molar ratio).

4 Claims, 1 Drawing Sheet

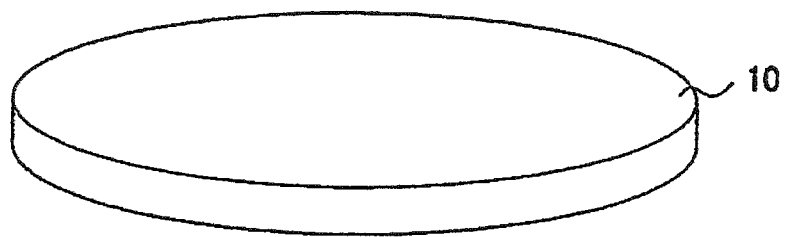

PIEZOELECTRIC CERAMIC COMPOSITION

TECHNICAL FIELD

This invention relates to an alkaline niobate piezoelectric ceramic composition that is used in the making of actuators, ultrasonic sensors, ultrasonic transducers or the like.

TECHNICAL BACKGROUND

Piezoelectric ceramic composition is used as a piezoelectric element in the making of actuators, ultrasonic sensors, ultrasonic transducers or the like. Since piezoelectric ceramic composition has an excellent piezoelectric property, lead zirconate titanate (PZT) or the like, containing a lead compound, has thus far been practically used. However, due to a concern that such said composition containing a lead compound may negatively affect the environment, a lead-free piezoelectric ceramic composition is now attracting attention and is being researched and developed. The alkaline niobate piezoelectric ceramic composition, as disclosed below in Patent Document 1, is such a piezoelectric ceramic composition free of a lead compound.

The piezoelectric ceramic composition, as disclosed in Patent Document 1, is described as the composition formula $\{Li_x(K_{1-y}Na_y)_{1-x}\}(Nb_{1-z}Sb_z)O_3$ within each composition range of x, y and z, such as $0<x\leq0.2$, $0<y<1$ and $0<z\leq0.2$.

PRIOR ART DOCUMENT

Patent document 1: JP Patent No. 4631246

DISCLOSURE OF THE INVENTION

Problems to be Resolved by the Invention

The inventors tried, by using the manufacturing method as described in Patent Document 1, to make the alkaline niobate piezoelectric ceramic composition of the aforementioned composition formula, but they found it hard to obtain a high-density ceramic, thus resulting in an insufficient piezoelectric property.

This invention was achieved, in light of the aforementioned problems, in providing a piezoelectric ceramic composition having a lead-free alkaline niobate piezoelectric ceramic composition with a favorable piezoelectric property.

Means of Solving the Problems

To solve the aforementioned problems, the first aspect of this invention refers to a piezoelectric ceramic composition that is described as the composition formula $\{Li_x(K_{1-y}Na_y)_{1-x}\}(Nb_{1-z}Sb_z)O_3$ including such additives as the metallic elements Bi and Fe within the range of the following relational expressions: $0.03 \leq x \leq 0.045$; $0.5 \leq y \leq 0.58$; $0.03 \leq z \leq 0.045$; and $0.006 \leq v \leq w \leq 0.010$ whereof v is the additive amount of Bi (molar ratio), and w is the additive amount of Fe (molar ratio).

The first aspect of this invention allows the metallic elements Bi and Fe to be added, in appropriate proportion, against the alkaline niobate composition as described in the composition formula $\{Li_x(K_{1-y}Na_y)_{1-x}\}(Nb_{1-z}Sb_z)O_3$, thus obtaining a lead-free piezoelectric ceramic composition having a favorable piezoelectric property.

The second aspect of this invention refers to the piezoelectric ceramic composition according to the first aspect of this invention of which the piezoelectric constant $d_{33}$ is 250 pC/N or more, and the Curie temperature is 330 degrees Celsius or more.

The piezoelectric ceramic composition incorporating the second aspect which is the piezoelectric constant $d_{33}$ of 250 pC/N or more, and the Curie temperature of 330 degrees Celsius or more, allows to obtain an electromechanical transformation device (piezoelectric actuator, ultrasonic sensor or the like) that has a favorable piezoelectric property and has excellent heat resistance.

The third aspect of this invention refers to the piezoelectric ceramic composition according to the first or second aspect of this invention, which is formed in a disk shape having a front and back surface, whereof the electromechanical coupling coefficient Kp in a radial mode is 0.44 or more, and the relative permittivity $\in_{33}^T/\in_0$ is 1390 or more.

The piezoelectric ceramic composition incorporating the third aspect which is the electromechanical coupling coefficient Kp in a radial mode of 0.44 or more, and is the relative permittivity $\in_{33}^T/\in_0$ of 1390 or more, allows for getting an electromechanical transformation device (piezoelectric actuator, ultrasonic sensor or the like) having a favorable piezoelectric property.

The fourth aspect of this invention refers to the piezoelectric ceramic composition according to the first or second aspect which is formed in a disk shape having a front and back surface, whereof the electromechanical coupling coefficient Kp in a radial mode is 0.44 or more, and the relative permittivity $\in_{33}^T/\in_0$ is 1390 or more, and the dielectric loss tan δ is 0.03 or less.

The piezoelectric ceramic composition incorporating the fourth aspect which is the electromechanical coupling coefficient Kp in a radial mode being 0.44 or more, and of the relative permittivity being $\in_{33}^T/\in_0$ of 1390 or more, and of the dielectric loss tan δ being 0.03 or less, allows in obtaining an electromechanical transformation device (piezoelectric actuator, ultrasonic sensor or the like) having a favorable piezoelectric property.

Effects of the Invention

As described above, the first to fourth aspects of this invention provides a lead-free piezoelectric ceramic composition having a favorable piezoelectric property.

BRIEF DESCRIPTION OF THE DRAWING

FIG. 1 is the oblique-perspective view of the embodiment of this invention.

MODE FOR CARRYING OUT THE INVENTION

Hereinafter, the embodiment of the piezoelectric ceramic composition of this invention is described in reference to FIG. 1.

FIG. 1 is the oblique-perspective view of the piezoelectric ceramic composition 10 of the embodiment of this invention. The piezoelectric ceramic composition 10 is of a disk shape having a front and back surface and is 15 mm in diameter and 1 mm thick. The piezoelectric ceramic composition 10 is used, for example, as the ultrasonic sensor to be incorporated in the ultrasonic flow meter.

The piezoelectric ceramic composition 10, as the embodiment of this invention, is a potassium-sodium niobate (alkaline niobate) piezoelectric ceramic composition comprising a crystal phase of a perovskite structure. Specifically, the piezoelectric ceramic composition 10 is of the ceramic composition as described below in the composition formula (1) and which contains the additives of metallic elements Bi (bismuth) and Fe (iron). Formula (1): $\{Li_x(K_{1-y}Na_y)_{1-x}\}(Nb_{1-z}Sb_z)O_3$.

However, the piezoelectric ceramic composition 10 comprises a formula to meet the range of $0.03 \le x \le 0.045$; $0.5 \le y \le 0.58$; $0.03 \le z \le 0.045$; and $0.006 \le v \le w \le 0.010$ whereof v is the additive amount of Bi (molar ratio), and w is the additive amount of Fe (molar ratio).

Hereinafter, the method for manufacturing the piezoelectric ceramic composition 10 is described.

First, the raw powder (of 99% or more of purity of grade) of $K_2CO_3$, $Na_2CO_3$, $Li_2CO_3$, $Nb_2O_5$, $Sb_2O_3$, $Bi_2O_3$ and $Fe_2O_3$ was prepared. To achieve each formula of Working Examples 1 to 18 and of Comparative Examples 1 to 19, as shown in Chart 1, the raw powder containing each metallic element was weighed. Then, using a ball-mill, the raw power was mixed in alcohol for 24 hours to get slurry. The type of raw powder (compound) containing each metallic element is not limited. An oxidized material, a carbonate or the like of each metallic element can be used.

The slurry obtained in the above process was dried, and calcinated at 900 degrees Celsius for three hours. Then, using a ball-mill, the calcined powder was crushed for 24 hours, and then a polyvinyl alcohol-water solution was added to the powder and which was granulated. Then, the granulated powder was pressed under 20 MPa of pressure into a disk 18 mm in diameter and 2 mm thick. The disk was sintered for 2.5 hours at 1,000 to 1,200 degrees Celsius, which is the appropriate temperature for obtaining a sintered body of maximum density.

Now, both surfaces of the sintered body was simultaneously polished until it became a disk approximately 15 mm in diameter and 1 mm thick, as shown in FIG. 1. Both surfaces of the disk were coated with the silver-paste and the disk was heated at 700 degrees Celsius to form the opposite electrodes. In silicone oil, at 130 degrees Celsius, a direct-current voltage of 3 kV/mm was applied to the opposite electrodes for 20 minutes to achieve polarization in the direction of thickness, thereby making the piezoelectric ceramic composition 10.

CHART 1

| | Formula $\{Li_x(K_{1-y}Na_y)_{1-x}\}(Nb_{1-z}Sb_z)O_3 +$ vBi + wFe | | | | | Electrical property | | | | |
|---|---|---|---|---|---|---|---|---|---|---|
| | X Li | Y Na | Z Sb | V Bi | W Fe | Piezoelectric constant $d_{33}$ (pC/N) | Radial mode Kp | Relative permittivity $\epsilon_{33}^T/\epsilon_0$ | dielectric loss tan δ | Curie temperature Tc (° C.) |
| Comparative Example 1 | 0.040 | 0.54 | 0.040 | 0.000 | 0.000 | 148 | 0.345 | 868 | 0.179 | 365 |
| Comparative Example 2 | 0.040 | 0.54 | 0.040 | 0.000 | 0.008 | 121 | 0.312 | 813 | 0.058 | 370 |
| Comparative Example 3 | 0.040 | 0.54 | 0.040 | 0.002 | 0.002 | 209 | 0.459 | 958 | 0.026 | 355 |
| Comparative Example 4 | 0.040 | 0.54 | 0.040 | 0.004 | 0.004 | 237 | 0.481 | 1105 | 0.023 | 345 |
| Comparative Example 5 | 0.040 | 0.54 | 0.040 | 0.004 | 0.008 | 214 | 0.436 | 1156 | 0.025 | 360 |
| Comparative Example 6 | 0.040 | 0.54 | 0.040 | 0.004 | 0.012 | 220 | 0.426 | 1154 | 0.027 | 370 |
| Comparative Example 7 | 0.040 | 0.54 | 0.040 | 0.005 | 0.008 | 240 | 0.448 | 1283 | 0.026 | 350 |
| Working Example 1 | 0.040 | 0.54 | 0.040 | 0.006 | 0.006 | 265 | 0.480 | 1392 | 0.023 | 345 |
| Working Example 2 | 0.040 | 0.54 | 0.040 | 0.006 | 0.007 | 264 | 0.469 | 1430 | 0.025 | 345 |
| Working Example 3 | 0.040 | 0.54 | 0.040 | 0.006 | 0.008 | 273 | 0.473 | 1479 | 0.025 | 345 |
| Working Example 4 | 0.040 | 0.54 | 0.040 | 0.006 | 0.009 | 261 | 0.466 | 1430 | 0.026 | 350 |
| Working Example 5 | 0.040 | 0.54 | 0.040 | 0.006 | 0.01 | 260 | 0.472 | 1408 | 0.025 | 345 |
| Working Example 6 | 0.040 | 0.54 | 0.040 | 0.007 | 0.007 | 274 | 0.485 | 1459 | 0.023 | 345 |
| Working Example 7 | 0.040 | 0.54 | 0.040 | 0.007 | 0.008 | 278 | 0.472. | 1484 | 0.025 | 345 |
| Comparative Example 8 | 0.040 | 0.54 | 0.040 | 0.008 | 0.006 | 241 | 0.461 | 1281 | 0.034 | 350 |
| Working Example 8 | 0.040 | 0.54 | 0.040 | 0.008 | 0.008 | 276 | 0.487 | 1501 | 0.024 | 345 |
| Working Example 9 | 0.040 | 0.54 | 0.040 | 0.008 | 0.01 | 254 | 0.471 | 1470 | 0.025 | 345 |
| Comparative Example 9 | 0.040 | 0.54 | 0.040 | 0.008 | 0.012 | 243 | 0.433 | 1370 | 0.027 | 345 |
| Working Example 10 | 0.040 | 0.54 | 0.040 | 0.009 | 0.009 | 280 | 0.472 | 1472 | 0.024 | 345 |
| Working Example 11 | 0.040 | 0.54 | 0.040 | 0.009 | 0.01 | 270 | 0.467 | 1457 | 0.025 | 345 |
| Comparative Example 10 | 0.040 | 0.54 | 0.040 | 0.010 | 0 | 89 | 0.198 | 1510 | 0.559 | 390 |
| Comparative Example 11 | 0.040 | 0.54 | 0.040 | 0.010 | 0.004 | 210 | 0.407 | 1175 | 0.089 | 335 |

CHART 1-continued

| | Formula $\{Li_x(K_{1-y}Na_y)_{1-x}\}(Nb_{1-z}Sb_z)O_3 + vBi + wFe$ | | | | | Electrical property | | | | |
|---|---|---|---|---|---|---|---|---|---|---|
| | X Li | Y Na | Z Sb | V Bi | W Fe | Piezoelectric constant $d_{33}$ (pC/N) | Radial mode Kp | Relative permittivity $\epsilon_{33}^T/\epsilon_0$ | dielectric loss tan δ | Curie temperature Tc (° C.) |
| Comparative Example 12 | 0.040 | 0.54 | 0.040 | 0.010 | 0.008 | 229 | 0.424 | 1392 | 0.051 | 345 |
| Working Example 12 | 0.040 | 0.54 | 0.040 | 0.010 | 0.01 | 251 | 0.447 | 1433 | 0.025 | 335 |
| Comparative Example 13 | 0.040 | 0.54 | 0.040 | 0.012 | 0.006 | 174 | .0355 | 1164 | 0.179 | 340 |
| Comparative Example 14 | 0.040 | 0.54 | 0.040 | 0.012 | 0.012 | 201 | 0.385 | 1282 | 0.027 | 350 |
| Comparative Example 15 | 0.040 | 0.54 | 0.040 | 0.016 | 0.004 | 59 | 0.171 | 805 | 0.282 | 400 |
| Comparative Example 16 | 0.040 | 0.54 | 0.040 | 0.016 | 0.008 | 132 | 0.229 | 1493 | 0.442 | 420 |
| Comparative Example 17 | 0.040 | 0.54 | 0.040 | 0.016 | 0.016 | 141 | 0.279 | 1270 | 0.028 | 390 |
| Working Example 13 | 0.040 | 0.50 | 0.040 | 0.008 | 0.008 | 274 | 0.486 | 1490 | 0.024 | 345 |
| Working Example 14 | 0.040 | 0.58 | 0.040 | 0.008 | 0.008 | 270 | 0.483 | 1492 | 0.024 | 345 |
| Working Example 15 | 0.030 | 0.54 | 0.030 | 0.008 | 0.008 | 256 | 0.478 | 1473 | 0.022 | 355 |
| Working Example 16 | 0.045 | 0.54 | 0.045 | 0.008 | 0.008 | 263 | 0.486 | 1500 | 0.023 | 340 |
| Comparative Example 18 | 0.050 | 0.54 | 0.050 | 0.008 | 0.008 | 240 | 0.426 | 1409 | 0.022 | 330 |
| Comparative Example 19 | 0.060 | 0.54 | 0.060 | 0.008 | 0.008 | 218 | 0.392 | 1358 | 0.021 | 320 |
| Working Example 17 | 0.030 | 0.54 | 0.045 | 0.008 | 0.008 | 262 | 0.480 | 1482 | 0.022 | 345 |
| Working Example 18 | 0.045 | 0.54 | 0.030 | 0.008 | 0.008 | 264 | 0.475 | 1478 | 0.022 | 345 |

Regarding each sample of the piezoelectric ceramic composition 10 according to Working Examples 1 to 18 and of Comparative Examples 1 to 19, the inventors measured the electrical property of said composition 10 of Working Examples 1 to 18 and of Comparative Examples 1 to 19. The results are shown in Chart 1.

Of the embodiment of this invention, each electrical property of the electromechanical coupling coefficient Kp of the relative permittivity $\epsilon_{33}^T/\epsilon_0$, and of the dielectric loss tan δ were measured at 25 degrees Celsius using an impedance analyzer (4294A: Agilent Technologies Inc.). Also, the piezoelectric constant $d_{33}$ was measured at 25 degrees Celsius using a $d_{33}/d_{31}$ meter (Model: ZJ-6B Institute of Acoustic Chinese Academy of Science). Regarding the Curie temperature Tc, the dielectric constant at the different temperature was measured using an impedance analyzer (4294A: Agilent Technologies Inc.), with the temperature of the maximum dielectric constant being determined as the Curie temperature Tc. Also, of the embodiment of this invention, the Curie temperature Tc was determined by measuring the dielectric constant whilst lowering the temperature. Furthermore, a high-temperature XRD analysis was conducted using an X-ray diffractometer (SmartLab: Rigaku Corporation, X-ray source: Cu Kα), thus verifying that the phase-transition from tetragonal-to-cubic-phase transition occurred near the Curie temperature Tc.

As shown in Chart 1, the piezoelectric ceramic composition 10, regarding Working Examples 1 to 18, meets the above formula (1) within the composition range of $0.03 \leq x \leq 0.045$; of $0.5 \leq y \leq 0.58$; of $0.03 \leq z \leq 0.045$; and of $0.006 \leq v \leq w \leq 0.010$. The piezoelectric ceramic composition 10, regarding Working Examples 1 to 18, has a favorable piezoelectric property of which the piezoelectric constant $d_{33}$ is 250 pC/N or more, and the Curie temperature Tc is 330 degrees Celsius or more. By adding the appropriate amount of Bi and Fe to the piezoelectric ceramic composition 10, regarding Working Examples 1 to 18, it is expected that the piezoelectric property will be enhanced, as below. In other words, if the appropriate amount of Bi and Fe is added, then the point defect is introduced to the lattice structure, thus expecting that the permissive amount of the A-site defect in the perovskite structure, which is described as $ABO_3$, will increase. Also, at the point where the A-site defect reaches the maximum, the optimum characteristics of the composition will then be obtained, which is caused by the occurrence of the A-site defect that easily makes the domain wall. Also, as the domain size becomes smaller, the piezoelectric property is expected to be favorable.

Chart 2 shows the piezoelectric constant $d_{33}$ (pC/N), according to v, which is the additive amount of Bi (molar ratio) and of w, which is the additive amount of Fe (molar ratio). Chart 2 also shows the piezoelectric constant $d_{33}$, according to v, which is the additive amount of Bi and of w which is the additive amount of Fe, regarding the samples of Working Examples 1 to 12 and of Comparative Examples 1 to 17, whereof the composition-ratio of x is 0.04; that of y is 0.54; and that of z is 0.04. As shown in Chart 2, the piezoelectric constant $d_{33}$ is 250pC/N or more within the composition range of $0.006 \leq v \leq w \leq 0.010$ (the composition range of Working Examples 1 to 12), which is a favorable piezoelectric property.

CHART 2

| v: Additive amount of Bi | w: Additive amount of Fe | | | | | | | | | |
|---|---|---|---|---|---|---|---|---|---|---|
| | 0 | 0.002 | 0.004 | 0.006 | 0.007 | 0.008 | 0.009 | 0.01 | 0.012 | 0.016 |
| 0 | 148 | | | | | 121 | | | | |
| 0.002 | | 209 | | | | | | | | |
| 0.004 | | | 237 | | | 214 | | | 220 | |
| 0.005 | | | | | | 240 | | | | |
| 0.006 | | | | 265 | 264 | 273 | 261 | 260 | | |
| 0.007 | | | | | 274 | 278 | | | | |
| 0.008 | | | | 241 | | 276 | | 254 | 243 | |
| 0.009 | | | | | | | 280 | 270 | | |
| 0.01 | 89 | | 210 | | | 229 | | 251 | | |
| 0.012 | | | | 174 | | | | | 201 | |
| 0.016 | | | 59 | | | 132 | | | | 141 |

Working Example 13 determines the composition-ratio y of Na to be 0.50, and Working Example 14 determines the composition-ratio y of Na to be 0.58, of which the composition-ratio x of Li and the composition-ratio z of Sb, as well as that of v: additive amount of Bi and w: additive amount of Fe, are all the same as the values of Working Example 8. As shown in Working Examples 13 and 14, even when the composition-ratio y of Na is changed from 0.50 to 0.58, the piezoelectric constant $d_{33}$ is 250 pC/N or more, thus obtaining a favorable piezoelectric property.

Working Example 15 determines the composition ratios x and z to be 0.03, and Working Example 16 determines the composition ratios x and z to be 0.45, of which the composition ratio y and the additive amount of Bi and Fe (v and w) are the same as the values of Working Example 8. Also, Working Examples 8, 15 and 16 determine the composition ratios x and y to be the same ratio. Working Example 17 determines the composition ratio x to be 0.03 and the composition ratio z to be 0.045, and Working Example 18 determines the composition ratio x to be 0.045 and the composition ratio z to be 0.03, of which the composition ratio y and the additive amount of Bi and Fe (v and w) are the same as the values of Working Example 8. As shown in Working Examples 15 to 18, when the composition ratios x and z are changed in the range of 0.03-0.045, the piezoelectric constant $d_{33}$, compared to that of Working Example 8, is slightly lowered. However, it is possible to obtain the piezoelectric constant $d_{33}$ of 250 pC/N or more, which is still a favorable piezoelectric property.

Comparative Examples 1 to 7 determine v: the additive amount of Bi to be 0.005 or less. Comparative Example 8 and 12 determine v: the additive amount of Bi to be more than w: the additive amount of Fe. Also, Comparative Examples 13 to 17 determine v: the additive amount of Bi to be 0.012 or more, and Comparative Examples 9, 14 and 17 determine w: the additive amount of Fe to be 0.012 or more. Comparative Examples 10 and 11 determine w: the additive amount of Fe to be 0.004 or less. Comparative Examples 18 and 19 determine the composition ratio x of Li to be 0.05 or more and the composition ratio z of Sb to be 0.05 or more. Comparative Example 1, of which neither Bi nor Fe is added, is the piezoelectric ceramic composition that corresponds to the composition shown in the conventional art as disclosed in the aforementioned Patent Document 1.

As shown in Charts 1 and 2, regarding Comparative Examples 1 to 17, whereof v: the additive amount of Bi, and w: the additive amount of Fe, are out of the composition range of $0.006 \leq v \leq w \leq 0.010$ (within the thick frame as shown in Chart 2), the piezoelectric constant $d_{33}$ is 240 pC/N or less.

Also, Comparative Examples 18 and 19 are out of the composition ranges of $0.03 \leq x \leq 0.045$ and $0.03 \leq z \leq 0.045$, and the piezoelectric constant $d_{33}$ is 240 pC/N or less.

Also, if the A-site defect on the perovskite structure, described as $ABO_3$, exists in the appropriate proportion (approximately 2%), the piezoelectric ceramic composition shows a favorable piezoelectric property. Therefore, it is possible to manufacture the piezoelectric ceramic composition 10 by compounding the A-site elements (Li, K and Na) and the B-site elements (Nb and Sb) until the ratio of A/B is from 0.95 to 1.0. As such, even when the B-site elements are excessive, adding Bi and Fe within the above mentioned range of $0.006 \leq v \leq w \leq 0.010$ allows the piezoelectric property to be enhanced.

Therefore, according to the embodiment of this invention, the following effect can be obtained.

(1) The piezoelectric ceramic composition 10, regarding Working Examples 1 to 18 as the embodiment of this invention, is manufactured to meet the above composition formula within the composition range of $0.03 \leq x \leq 0.045$; of $0.5 \leq y \leq 0.58$, of $0.03 \leq z \leq 0.045$; and of $0.006 \leq v \leq w \leq 0.010$. Manufacturing the piezoelectric ceramic composition 10 within such composition ranges allows for the obtainment of a favorable piezoelectric property of which the piezoelectric constant $d_{33}$ is 250 pC/N or more, and the Curie temperature Tc is 330 degrees Celsius or more. The piezoelectric ceramic composition 10, regarding Working Examples 1 to 18, show the favorable electrical properties of which the electromechanical coupling coefficient Kp in a radial mode is 0.44 or more, and of which the relative permittivity $\epsilon_{33}^T/\epsilon_0$ is 1390 or more, and of which the dielectric loss tan δ is 0.03 or less. Therefore, when making the ultrasonic sensor that is used, for example, in the ultrasonic flow meter using the piezoelectric ceramic composition 10, regarding Working Examples 1 to 18, such a sensor can efficiently transmit ultrasonic waves. Also, even whilst using the ultrasonic flow meter at a comparatively high temperature (i.e. 200 degrees Celsius), the measurement of flow of solution can accurately be done.

(2) The piezoelectric ceramic composition 10, regarding Working Examples 6 to 8 and 10 as the embodiment of this invention, is manufactured within the composition range of $0.007 \leq v \leq w \leq 0.009$. Manufacturing the piezoelectric ceramic composition 10, within such composition range, allows for the obtainment of a favorable piezoelectric property of which the piezoelectric constant $d_{33}$ is 270 pC/N or more; the Curie temperature Tc is 340 degrees Celsius or more; the electromechanical coupling coefficient Kp in a radial mode is 0.47 or more; the relative permittivity $\epsilon_{33}^T/\epsilon_0$ is 1450 or more; and the dielectric loss tan δ is 0.025 or less.

(3) The piezoelectric ceramic composition 10, regarding Working Examples 1 to 18 as the embodiment of this invention, is manufactured without containing lead, thus avoiding an adverse environmental effect when said composition 10 is discarded.

(4) The piezoelectric ceramic composition 10, regarding Working Examples 1 to 18 as the embodiment of this invention, contains no Ta (tantalum) as the B-site element of the perovskite structure, described as $ABO_3$. It is known that the potassium-sodium niobate piezoelectric ceramic composition, containing Ta as the B-site element, shows a favorable piezoelectric property. However, Ta is costly compared to other elements (such as Nb or Sb). Therefore, the embodiment of this invention, which contains no Ta, can provide a piezoelectric ceramic composition 10 having a favorable piezoelectric property, thus reducing the cost of manufacturing.

The embodiment can be modified, as follows.

The piezoelectric ceramic composition 10, as the above embodiment of this invention, is used as the ultrasonic sensor of the ultrasonic flow meter, but it is not limited to that use. Specifically, for example, it is possible to use the piezoelectric ceramic composition 10 as an air-bubble detection sensor to measure the decreasing rate of the ultrasonic waves propagating in the solution and to judge the existence or non-existence of the bubbles based on such a decreasing rate, or said composition 10 can be used as an ultrasonic-concentration meter to detect the concentration of solution based on the decreasing rate of the ultrasonic waves. In addition, it is possible to use the piezoelectric ceramic composition 10 as a knocking sensor in an engine or an actuator, or as an ultrasonic transducer in an ultrasonic cleaning machine or the like. Furthermore, the piezoelectric ceramic composition 10 is disk-shaped. Yet, the shape or size of said composition 10 can also be modified according to the intended use.

Besides the technical ideas as described in this invention, other technical ideas to be understood are described hereinafter.

(1) The piezoelectric ceramic composition, according to any one of the first to fourth aspects of this invention, is characterized in that v, the additive amount of Bi, and w, the additive amount of Fe, meet the range of $0.007 \leq v \leq w \leq 0.009$.

(2) The piezoelectric ceramic composition, according to the above technical idea (1), is characterized in that the piezoelectric constant $d_{33}$ is 270 pC/N or more, and the Curie temperature is 340 degrees Celsius or more.

(3) The piezoelectric ceramic composition, according to the above technical idea (2), is characterized in that the electromechanical coupling-coefficient Kp in a radial mode is 0.47 or more; the relative permittivity $\epsilon_{33}^T/\epsilon_0$ is 1450 or more; and the dielectric loss tan δ is 0.025 or less.

(4) The piezoelectric ceramic composition, according to any one of the first to fourth aspects of this invention, is characterized in that v, the additive amount of Bi, is less than w, the additive amount of Fe.

(5) The piezoelectric ceramic composition, according to any one of the first to fourth aspects of this invention, is characterized in that the said composition contains no lead.

(6) The piezoelectric ceramic composition, according to any one of the first to fourth aspects of this invention, is characterized in that the said composition is used as an ultrasonic sensor.

(7) The piezoelectric ceramic composition, according to any one of the first to fourth aspects of this invention, is characterized in that the said composition is used as an actuator.

Description of The Reference Sign

10: Piezoelectric ceramic composition

The invention claimed is:

1. A piezoelectric ceramic composition according to the composition formula $\{Li_x(K_{1-y}Na_y)_{1-x}\}(Nb_{1-z}Sb_z)O_3$ including additives as the metallic elements Bi and Fe within the range of the following relational expressions: $0.03 \leq x \leq 0.045$; $0.5 \leq y \leq 0.58$; $0.03 \leq z \leq 0.045$; and $0.006 \leq v < w \leq 0.010$ whereof v is the additive amount of Bi (molar ratio), and w is the additive amount of Fe (molar ratio), and having a piezoelectric constant $d_{33}$ is 250 pC/N or more.

2. A piezoelectric ceramic composition according to claim 1 of which the the Curie temperature is 330 degrees Celsius or more.

3. A piezoelectric ceramic composition according to claim 1, which is formed in a disk shape having a front and back surface, whereof the electromechanical coupling coefficient Kp in a radial mode is 0.44 or more, and the relative permittivity $\epsilon_{33}^T/\epsilon_0$ is 1390 or more.

4. A piezoelectric ceramic composition according to claim 1, which is formed in a disk shape having a front and back surface, whereof the electromechanical coupling coefficient Kp in a radial mode is 0.44 or more, and the relative permittivity $\epsilon_{33}^T/\epsilon_0$ is 1390 or more, and the dielectric loss tan δ is 0.03 or less.

* * * * *